United States Patent
Okawara

(10) Patent No.: US 9,780,341 B2
(45) Date of Patent: Oct. 3, 2017

(54) SHADOW MASK, METHOD OF MANUFACTURING A SHADOW MASK AND METHOD OF MANUFACTURING A DISPLAY DEVICE USING A SHADOW MASK

(71) Applicant: Japan Display Inc., Minato-ku (JP)

(72) Inventor: Takeshi Okawara, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/392,573

(22) Filed: Dec. 28, 2016

(65) Prior Publication Data
US 2017/0250381 A1    Aug. 31, 2017

(30) Foreign Application Priority Data
Feb. 25, 2016    (JP) .................. 2016-034014

(51) Int. Cl.
| | | |
|---|---|---|
| H01L 35/24 | (2006.01) | |
| H01L 51/00 | (2006.01) | |
| G01R 31/26 | (2014.01) | |
| H01L 21/66 | (2006.01) | |
| B05D 1/32 | (2006.01) | |
| H01L 51/56 | (2006.01) | |
| C23C 14/22 | (2006.01) | |
| C23C 14/12 | (2006.01) | |
| H01L 51/52 | (2006.01) | |

(52) U.S. Cl.
CPC ............. *H01L 51/56* (2013.01); *C23C 14/12* (2013.01); *C23C 14/22* (2013.01); *H01L 51/5253* (2013.01)

(58) Field of Classification Search
CPC ..... H01L 51/56; H01L 51/5253; C23C 14/22; C23C 14/12
USPC .............................. 438/26; 257/40; 427/468
See application file for complete search history.

(56) References Cited

U.S. PATENT DOCUMENTS

| | | | |
|---|---|---|---|
| 2003/0180474 A1 | 9/2003 | Nishikawa | |
| 2015/0289384 A1* | 10/2015 | Iwashita | H05K 3/185 174/250 |

FOREIGN PATENT DOCUMENTS

| | | |
|---|---|---|
| JP | 2003-253434 | 9/2003 |
| JP | 2007-95411 | 4/2007 |
| JP | 2013-241667 | 12/2013 |

* cited by examiner

*Primary Examiner* — David S Blum
(74) *Attorney, Agent, or Firm* — Oblon, McClelland, Maier & Neustadt, L.L.P.

(57) ABSTRACT

A shadow mask is used for patterning in a film deposition process in which a film deposition material is deposited by vapor deposition or sputtering. The shadow mask includes a first resin film provided on a side facing a film deposition target, a metal part having a slit formed therein and provided on top of the first resin film, and a second resin film provided in such a way as to cover at least a part of a top of the metal part. The second resin film is provided on a side exposed to a film deposition material, and a surface of the second resin film is roughened.

8 Claims, 8 Drawing Sheets

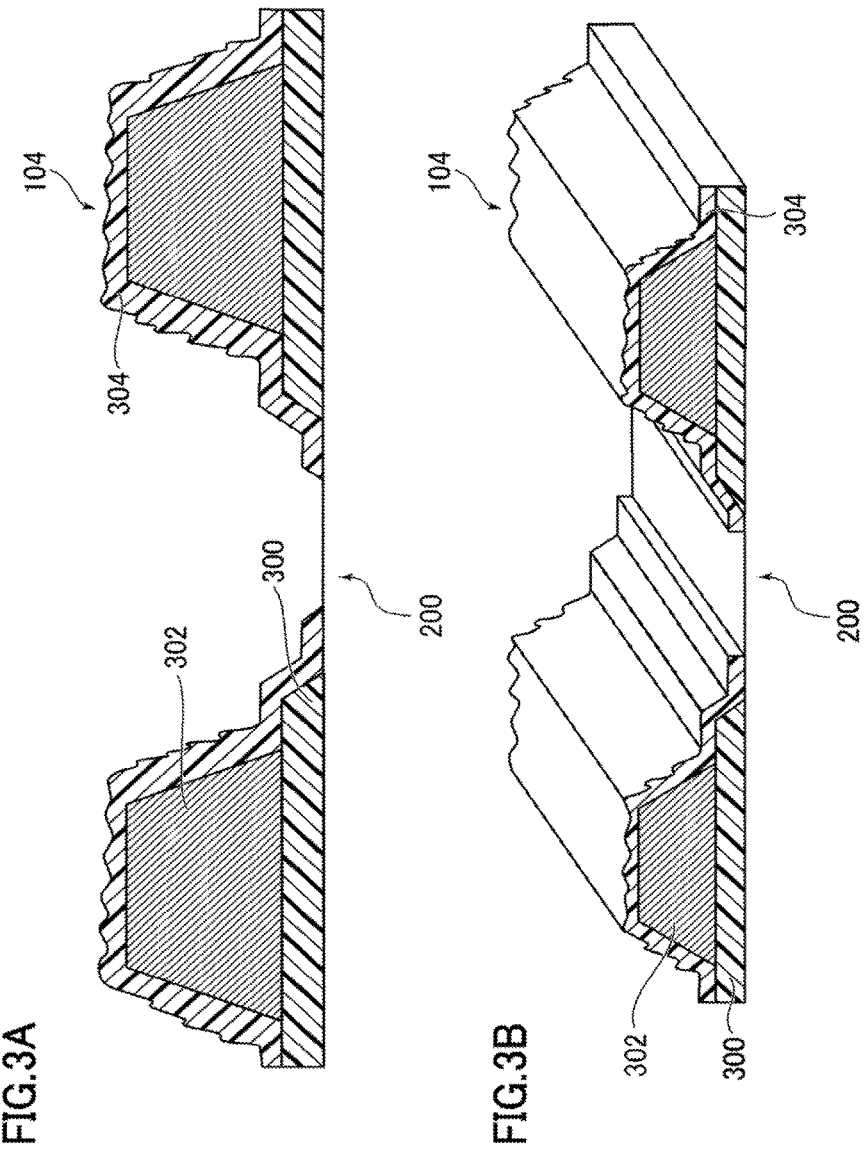

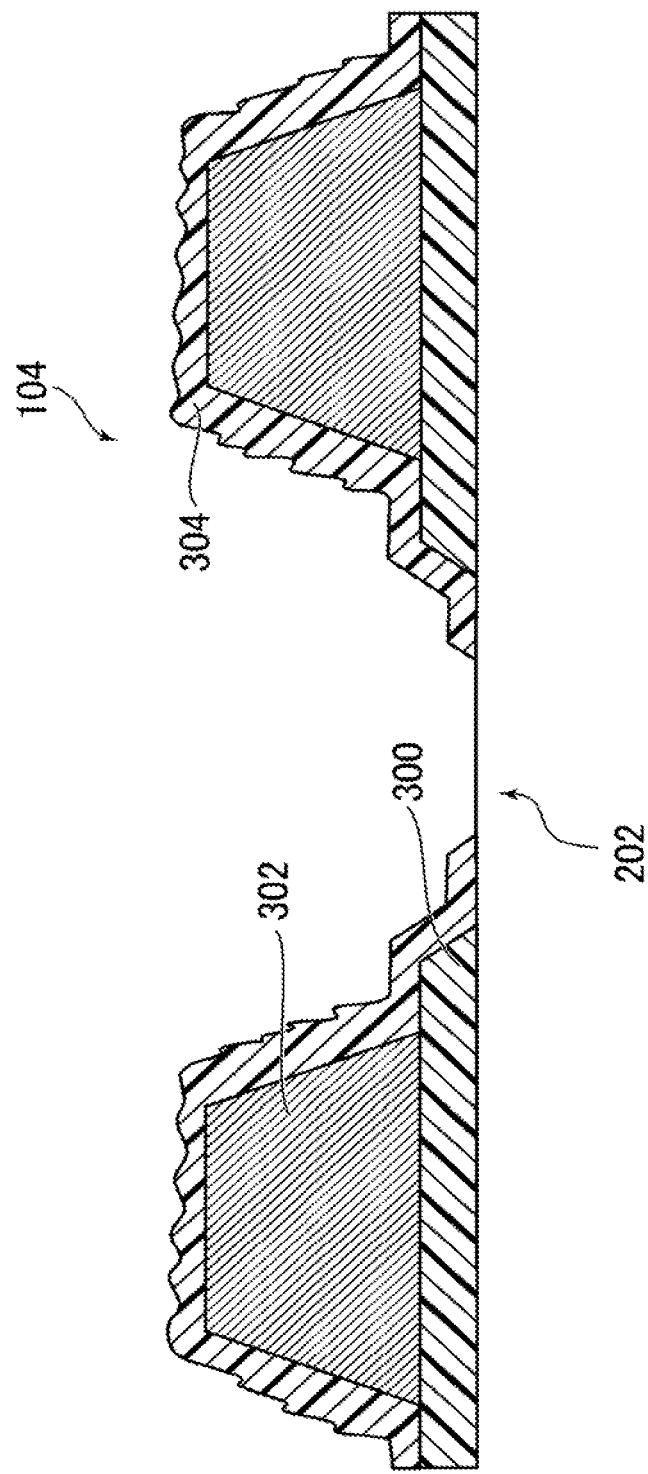

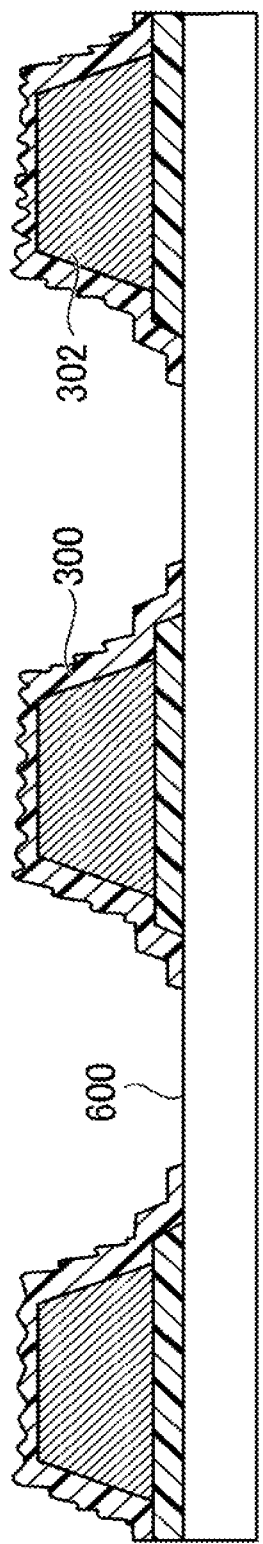
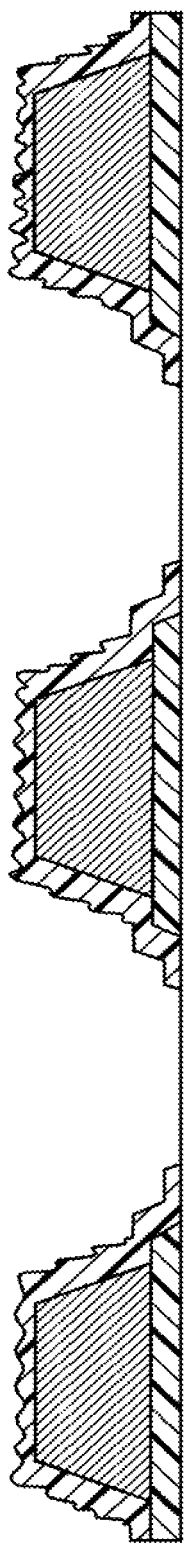

SHADOW MASK, METHOD OF MANUFACTURING A SHADOW MASK AND METHOD OF MANUFACTURING A DISPLAY DEVICE USING A SHADOW MASK

CROSS-REFERENCE TO RELATED APPLICATION

The present application claims priority from the Japanese Application JP 2016-34014 filed on Feb. 25, 2016, the content of which is hereby incorporated by reference into this application.

BACKGROUND OF THE INVENTION

1. Field of the Invention

The present invention relates to a shadow mask, a method of manufacturing a shadow mask, and a method of manufacturing a display device using a shadow mask.

2. Description of the Related Art

Recently, an organic EL display device using an organic EL (electro-luminescent) element has been in practical use. In some cases, a vapor deposition method is employed at the time of forming an organic layer and a cathode electrode of the organic EL element. In order to form the above organic layer and cathode electrode in a desired shape, a shadow mask formed with multiple fine slits arranged in parallel is used. As display devices have higher definition and higher image quality, the development of the shadow mask is under way. The shadow mask is also called a vapor deposition mask or metal mask.

For example, JP2013-241667A discloses that a vapor deposition mask, formed by stacking a metal mask provided with slits and a resin mask provided with patterns prepared by vapor deposition in positions overlapping with the slits, is formed by photolithography, thus achieving higher definition of the processing accuracy of the vapor deposition mask.

JP2007-95411A discloses that, in a metal mask for organic EL for forming an organic EL layer on a substrate, a resin protrusion is provided on the outer perimeter of a display unit on the side facing the substrate at the time of vapor deposition, of the metal mask for organic EL, thus preventing the metal mask and the substrate from contacting each other and preventing damage to the substrate surface due to foreign matters and scratches.

JP2003-253434A discloses that, in a vapor deposition method in which a pattern is formed by bringing a vapor deposition mask in tight contact with the surface of a substrate and then depositing a vapor deposition material on the surface of the substrate via an opening in the vapor deposition mask from a vapor deposition source, the surface of the vapor deposition mask that faces the substrate surface is roughened by sandblasting, thereby preventing the separation of the vapor deposition material.

SUMMARY OF THE INVENTION

In a vapor deposition mask with its surface formed of a resin, as disclosed in JP2013-241667A and JP2007-95411A, the surface is smoother than that of a vapor deposition mask with its surface formed of a metal. Therefore, a film deposited on the surface of the vapor deposition mask may come off. If the film deposited on the surface of the vapor deposition mask comes off, the film that comes off contaminates the vapor deposition source, and impurities get into the film formed by the contaminated vapor deposition source.

Meanwhile, in the case where the target of surface roughening is a vapor deposition mask with its surface formed of a resin, as disclosed in JP2003-253434A, the resin itself may come off when the surface is roughened by sandblasting.

In view of the foregoing problems, it is an object of the invention to provide a shadow mask which is provided with a resin on its surface and is used for patterning in a film deposition process and in which the resin will not come off at the time of surface roughening and therefore the film deposition material deposited on the resin will not come off easily, and a display device manufactured using this shadow mask.

According to one aspect of the present invention, a shadow mask includes a first resin film provided on a side facing a film deposition target, a metal part having a slit formed therein and provided on top of the first resin film, and a second resin film provided in such a way as to cover at least a part of a top of the metal part. The second resin film is provided on a side exposed to a film deposition material, and a surface of the second resin film is roughened.

In one embodiment of the present invention, the second resin film has an opening corresponding to a pattern to be prepared, at a position overlapping with the slit, and is formed in such a way as to cover the first resin film and the metal part.

In one embodiment of the present invention, the first resin film has an opening corresponding to a pattern to be prepared, at a position overlapping with the slit, and the second resin is formed in such a way as to cover the metal part.

In one embodiment of the present invention, the surface of the second resin film is roughened by a laser beam.

In one embodiment of the present invention, the surface of the second resin film is roughened by ashing.

In one embodiment of the present invention, the second resin film is thinner than the first resin film.

According to another aspect of the present invention, there is provided a method of manufacturing a shadow mask. The method includes steps of forming a first resin film on a base, bonding a metal part having a slit provided therein onto the first resin film, eliminating the first resin film formed at a part of an area where the slit is provided, forming a second resin film in such a way as to cover the metal part, the first resin film, and the base, roughening a surface of the second resin film, forming an opening corresponding to a pattern to be prepared, in the second resin film, and eliminating the base.

According to another aspect of the present invention, there is provided a method of manufacturing a display device. The method includes steps of forming a first resin film on a base, bonding a metal part having a slit provided therein onto the first resin film, eliminating the first resin film formed at a part of an area where the slit is provided, forming a second resin film in such a way as to cover the metal part, the first resin film, and the base, roughening a surface of the second resin film, forming an opening corresponding to a pattern to be prepared, in the second resin film, eliminating the base and obtaining a shadow mask, and forming a film of the pattern in a display panel, using the shadow mask.

BRIEF DESCRIPTION OF THE DRAWINGS

FIGS. 3A and 3B are a cross-sectional view showing a III-III cross section of FIG. 2 and a bird's-eye view showing the vicinities of the III-III cross section.

FIG. 5 shows a cross section of a mask foil in another example.

FIGS. 8A and 8B illustrate the process of manufacturing the mask foil.

DETAILED DESCRIPTION OF THE INVENTION

Hereinafter, each embodiment of the invention will be described with reference to the drawings. In order to clarify the explanation, the drawings may schematically show the width, thickness, shape and the like of each part, compared with the actual configuration. However, this is simply an example and should not limit the interpretation of the invention. In the description and the drawings, elements similar to those described with reference to drawings that are already mentioned may be denoted by the same reference signs and detailed description of such elements may be omitted when it is appropriate.

Figure 1A:
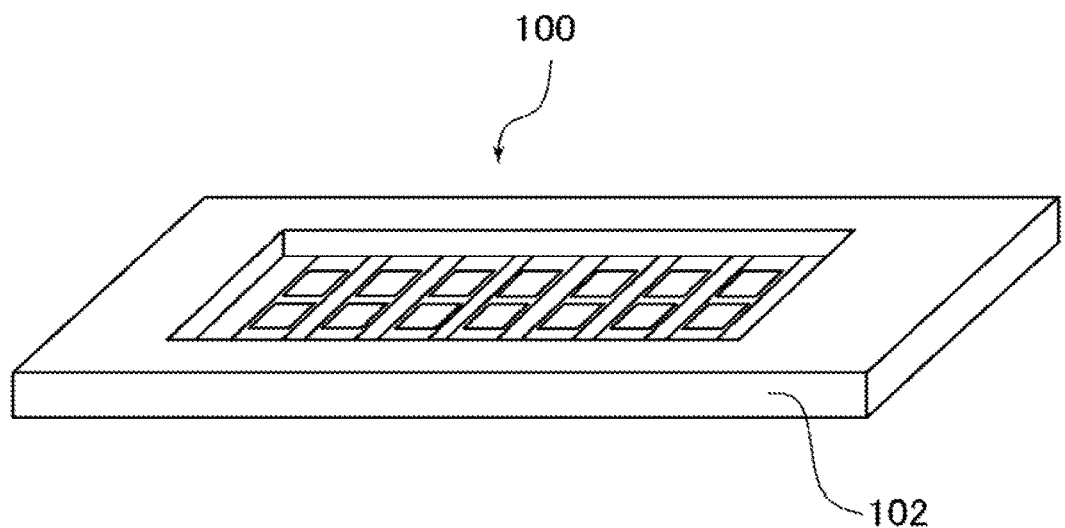
FIGS. 1A and 1B schematically show a shadow mask according to an embodiment of the invention.
Figure 1B:
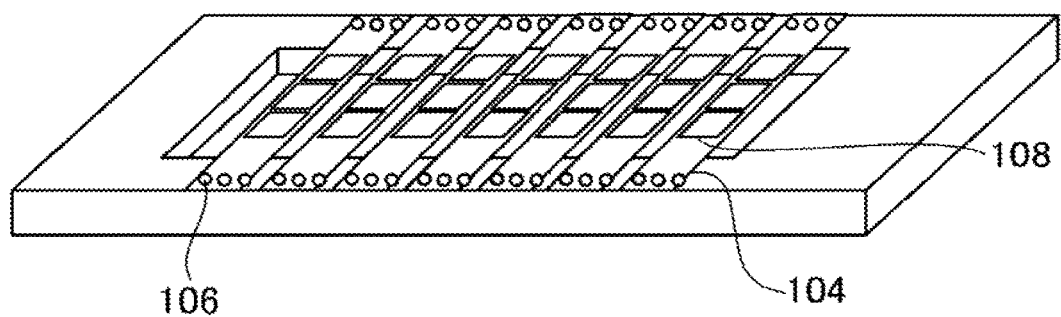

FIGS. 1A and 1B schematically show a shadow mask 100 according to an embodiment of the invention. FIG. 1A shows the shadow mask 100, as viewed from the side exposed to a film deposition material. FIG. 1B shows the shadow mask 100, as viewed from the side that faces a film deposition target. As shown in the illustrations, the shadow mask 100 includes a metal frame 102 and a plurality of strip-like mask foils 104 welded to the frame 102 at welding parts 106.

Each mask foil 104 has an opening 200 (see FIG. 2) corresponding to a film deposition pattern. Specifically, for example, in the case where the film deposition target is a plurality of display panels formed on a single glass substrate, the mask foil 104 has the opening 200 corresponding to the film deposition pattern at each of positions 108 corresponding to the plurality of display panels.

The shadow mask 100 is used for patterning in a film deposition process in which a film deposition material is deposited. Specifically, the shadow mask 100 is used in the state where the film deposition target is arranged on the side where the mask foils 104 are welded and where a vapor deposition source or the like arranged on the opposite side, at the time of depositing the film deposition material.

The welded mask foils 104 can be stripped off the frame 102. Therefore, according to the configuration of the shadow mask 100 shown in FIGS. 1A and 1B, even when changing the shape of the film deposition pattern, only the mask foils 104 need to be replaced, whereas the frame 102 can be used as it is. Therefore, the cost of the shadow mask 100 can be reduced. Meanwhile, the configuration of the shadow mask 100 shown in FIGS. 1A and 1B is an example and a configuration without having the frame 102 may be also employed.

Figure 2:
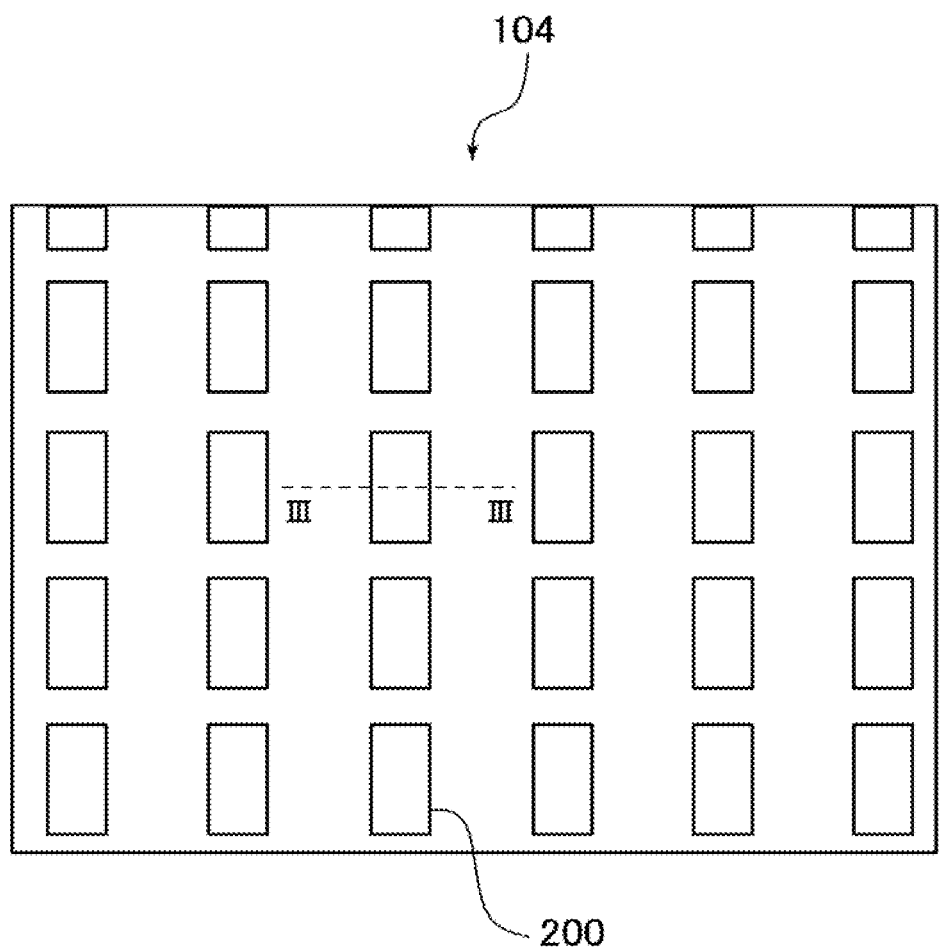
FIG. 2 is an enlarged view of a part of a mask foil.

FIG. 2 is an enlarged view of a part of the area corresponding to a single display panel, of the positions 108 corresponding respectively to the plurality of display panels, in the mask foil 104. As shown in FIG. 2, the mask foil 104 has openings 200 corresponding to a pattern to be prepared. While a pattern in which rectangular openings 200 are provided, each corresponding to a subpixel in the display panel, is shown as an example in FIG. 2, the film deposition pattern is not limited to this example.

The opening 200 in the mask foil 104 shown in FIG. 2 will be described further in detail. FIGS. 3A and 3B show a III-III cross section of FIG. 2 (FIG. 3A) and a bird's-eye view showing the vicinities of the III-III cross section (FIG. 3B). As shown in FIGS. 3A and 3B, the mask foil 104 includes a first resin film 300, a metal part 302, and a second resin film 304.

The first resin film 300 is provided on the side that faces the film deposition target. Specifically, for example, the first resin film 300 is provided on the side of the display panel as the film deposition target, having a tilted part near the opening 200. While it is desirable that the first resin film 300 is formed of a resin such as polyimide, epoxy, or acrylic resin, an inorganic material such as silicon oxide may also be used.

The metal part 302 is provided on top of the first resin film 300 and has a slit formed therein. Specifically, for example, in the metal part 302, a slit which is larger than the opening 200 is formed at the position overlapping with the opening 200. Also, in the metal part 302, the surface where the slit is formed is tilted and provided on top of the first resin film 300 in such a way as to form steps together with the first resin film 300. The metal part 302 is formed of an invar material, for example.

The second resin film 304 is provided on the side exposed to the film deposition material in such a way as to cover at least a part of the top of the metal part 302. Specifically, as shown in FIGS. 3A and 3B, for example, the second resin film 304 is provided on the side where the vapor deposition source, the target of a sputtering device or the like is arranged in such a way as to cover the entirety of the first resin film 300 and the metal part 302. It is desirable that the second resin film 304 is formed of a resin such as polyimide, epoxy, or acrylic resin, for example, similarly to the first resin film 300. However, an inorganic material such as silicon oxide may also be used.

The surface of the second resin film 304 is roughened. Specifically, for example, in the areas of the second resin film 304 formed to cover the top and lateral parts of the metal part 302, roughening is carried out to form recesses and protrusions. Here, since the thickness of the mask foil 104 is approximately 0.02 to 0.2 mm, it is desirable that the difference in height between the recessed part and the protruding part of the surface of the second resin film 304 is sufficiently smaller than 0.02 mm. In FIGS. 3A and 3B, of the second resin film 304, only the areas provided to cover the top and lateral parts of the metal part 302 are roughened. However, the entire surface of the second resin film 304 may be roughened. The roughening method will be described later.

The roughening of the surface of the second resin film 304 enables a reduction in the risk that the film deposition material deposited on the mask foil 104 may come off. That is, the film deposition material deposited in the recessed part formed on the surface of the second resin film 304 will come off less easily than the film deposition material deposited on a flat resin film or the like. Therefore, the deposited vapor deposition material is prevented from coming off and contaminating the vapor deposition source and the inside of the sputtering device or the like arranged on the side of the second resin film 304.

Moreover, the second resin film 304 has the opening 200 corresponding to the pattern to be prepared, at the position overlapping with the slit. Specifically, the second resin film 304 has the opening corresponding to the pattern to be prepared for the display panel, at the position overlapping with the slit of the metal part 302. The shape of the film to be formed on the film deposition target is decided by the shape of the opening 200 provided in the second resin film 304. For example, a rectangular opening 200 as shown in FIG. 2 and FIGS. 3A and 3B is provided. The film formed using the mask foil 104 has the same shape as the opening 200 formed in the second resin film 304.

It is desirable that the second resin film 304 is formed to be thinner than the first resin film 300. Specifically, it is desirable that the second resin film 304 is formed to a thickness that is approximately half the thickness of the first resin film 300, for example, as shown in FIGS. 3A and 3B. As the second resin film 304 is formed to be thinner than the first resin film 300, the mask foil 104 includes an area where the second resin film 304 is formed on top of the metal part 302, an area where the second resin film 304 is formed on top of the first resin film 300, and an area where only the second resin film 304 is formed. Thus, areas with three different heights are formed like steps.

Since the mask foil 104 is formed in the form of steps, the height of the film formed in the opening 200 can be made uniform. Here, the variation in the film thickness in the case where film deposition is carried out using the mask foil 104 formed solely by the metal part 302 with a slit will be described, for example.

Figure 4A:
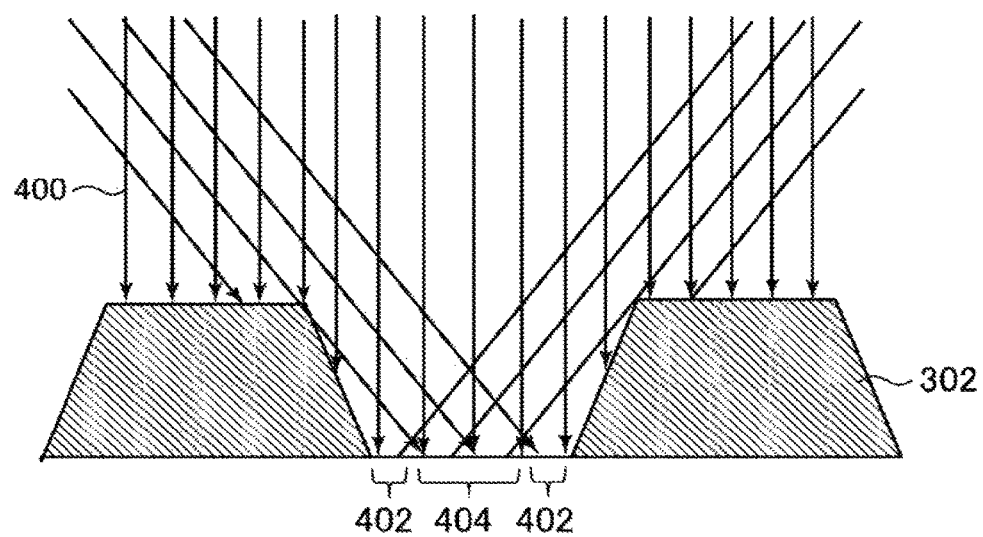
FIGS. 4A to 4C illustrate an example in which the thickness of a resulting film varies.
Figure 4B:
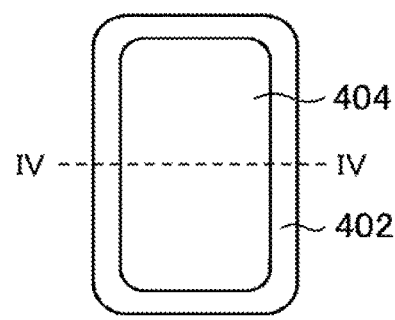
Figure 4C:
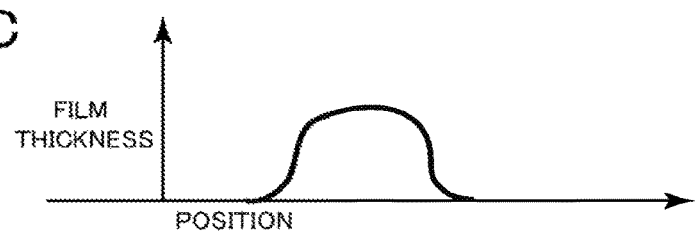

FIG. 4A shows the direction in which molecules of the film deposited on the film deposition target become incident. Here, the arrows in FIG. 4A indicate a direction 400 in which molecules to become incident on the film deposition target become incident on the film deposition target. FIG. 4B shows the thickness of the film formed in the opening 200 at one position, as viewed in a plan view. FIG. 4C shows the variation in the film thickness in a IV-IV cross section of FIG. 4B. The horizontal axis in the illustration represents position, and the vertical axis represents thickness.

As shown in FIGS. 4A to 4C, in the case where film deposition is carried out using the mask foil 104 formed solely of the metal part 302 with a slit, the deposited film has variation in the film thickness. Specifically, as shown in FIG. 4A, the film deposited at a center part 404 of the slit includes molecules which become vertically incident on the film deposition target and molecules which become obliquely incident.

Meanwhile, at an end part 402, a part of the molecules which become obliquely incident does not reach the film deposition target, due to the metal part 302 acting as a barrier. Therefore, as shown in FIGS. 4B and 4C, variation in the film thickness occurs in such a way that the film deposited at the end part 402 of the slit is thinner than the film deposited at the center part 404 of the slit.

However, by making the second resin film 304 to be thinner near the opening 200 and forming the mask foil 104 in the form of steps, as in the above embodiment, molecules which become obliquely incident can be prevented from being interrupted at the end part of the opening 200 and therefore a film with a uniform height can be formed.

While an embodiment in which the mask foil 104 is formed in the form of steps so as to have areas with three different heights is described above, the mask foil 104 may be formed including areas with two different heights. That is, as shown in FIG. 5, the first resin film 300 may have the opening 200 corresponding to the pattern to be prepared, at the position overlapping with the slit, and the second resin film 304 may be formed to cover the metal part 302 and apart of the first resin film 300. Even with this configuration, since the mask foil 104 is formed in the form of steps to provide areas with two different heights, the variation in the film thickness can be reduced, compared with the case where the mask foil 104 is formed solely of the metal part 302.

Next, the process of manufacturing the mask foil 104 according to the invention will be described. FIGS. 6A to 8B show the method of manufacturing the mask foil 104 used for patterning in the film deposition process in which the film deposition material is deposited, according to the embodiment of the invention.

Figure 6A:
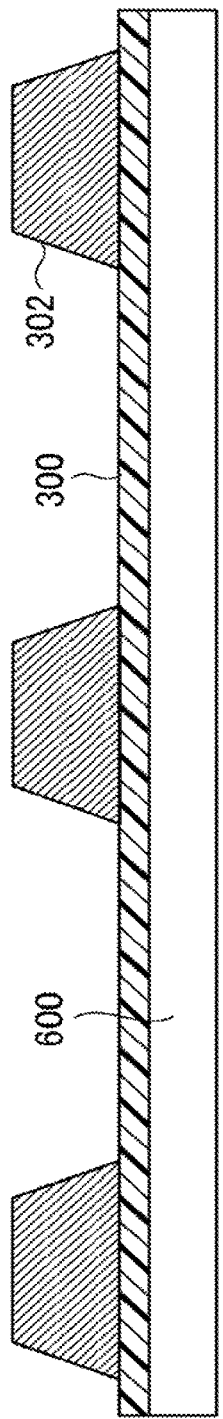
FIGS. 6A to 6C illustrate a process of manufacturing a mask foil.

First, as shown in FIG. 6A, the first resin film 300 is formed on a base 600, covering the entire surface of the base 600. Moreover, the metal part 302 provided with a slit is bonded onto the first resin film 300. The method of manufacturing the metal part 302 provided with a slit is similar to the related-art technique and therefore will not be described further in detail here.

Figure 6B:
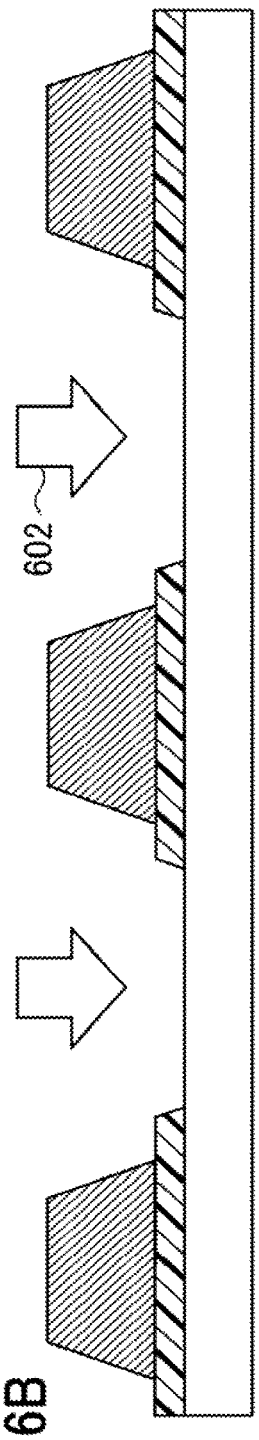

Next, as shown in FIG. 6B, the first resin film 300 formed at a part of the area where the slit is provided is eliminated. Specifically, for example, with a light shielding mask which transmits a laser beam 602 only in the area where the first resin film 300 is to be eliminated, the laser beam 602 is cast on the entire light shielding mask. Thus, the laser beam 602 is cast only on the area where the first resin film 300 is to be eliminated. By the laser beam 602, the first resin film 300 formed at the part of the area where the slit is provided is eliminated.

Figure 6C:
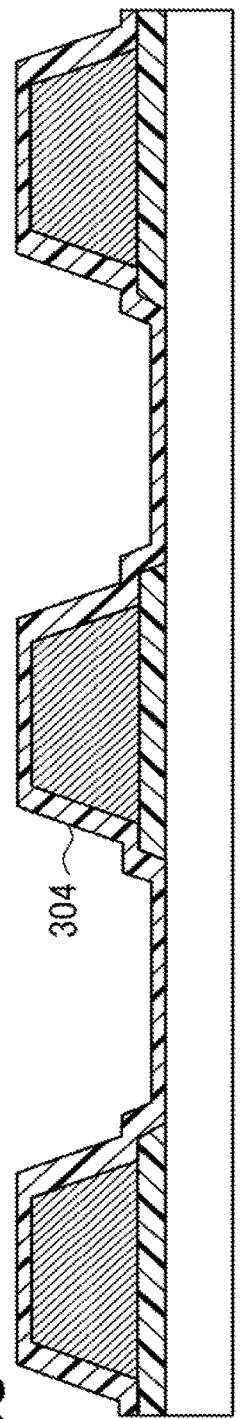
Figure 7A:
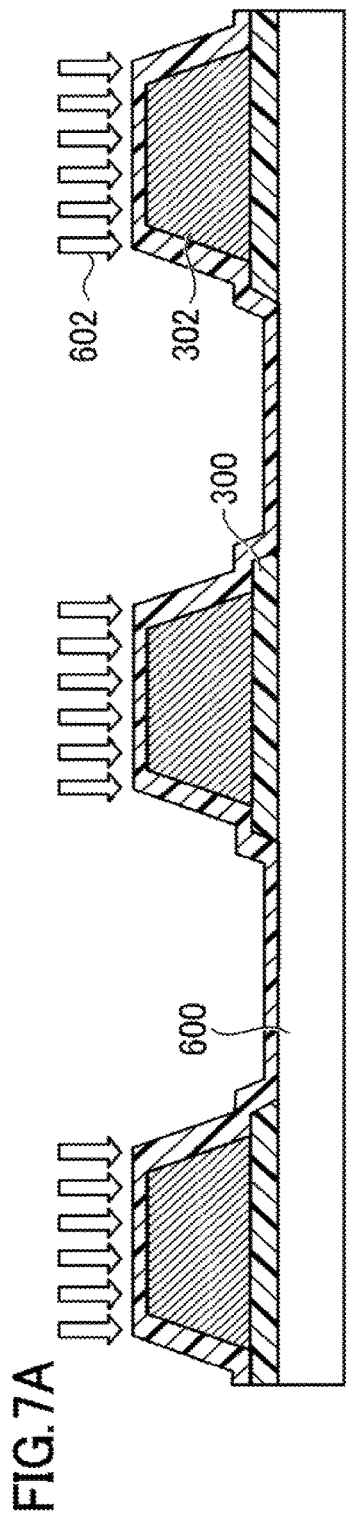
FIGS. 7A to 7C illustrate the process of manufacturing the mask foil.

Subsequently, as shown in FIG. 6C, the second resin film 304 is formed in such a way as to cover the metal part 302, the first resin film 300, and the base 600. Moreover, as shown in FIG. 7A, the surface of the second resin film 304 is roughened. Specifically, for example, with a light shielding mask which transmits the laser beam 602 only in the area where surface roughening is to be carried out, the laser beam 602 is cast on the entire light shielding mask. Thus, the laser beam 602 is cast only on the area where the surface roughening is to be carried out.

Figure 7B:
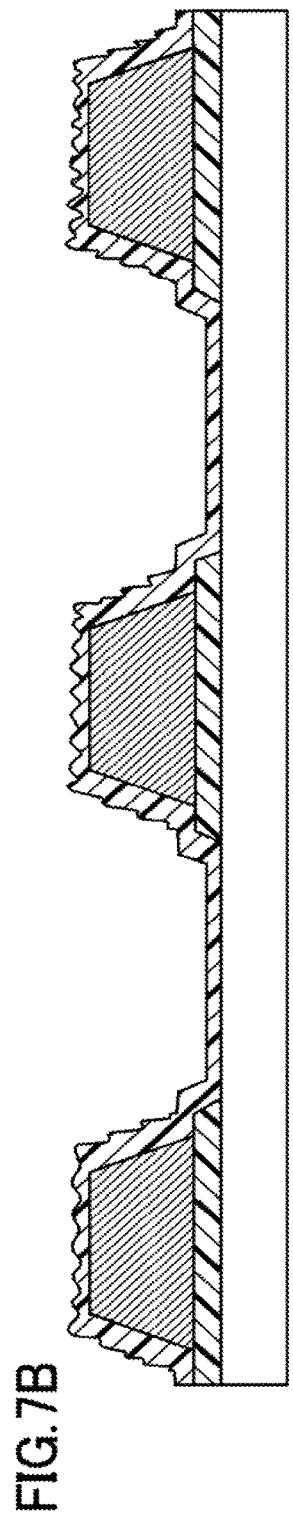

Here, as the laser beam 602 used for the surface roughening, a laser beam 602 with lower energy than the laser beam 602 used in the process of eliminating the first resin film 300 is used. That is, the second resin film 304 provided in the area where the surface roughening is to be carried out is irradiated with a laser beam 602 with an intensity which does not eliminate the second resin film 304. As the laser beam 602 is cast, the surface of the second resin film 304 provided in the area irradiated with the laser beam 602 is roughened, as shown in FIG. 7B.

Figure 7C:
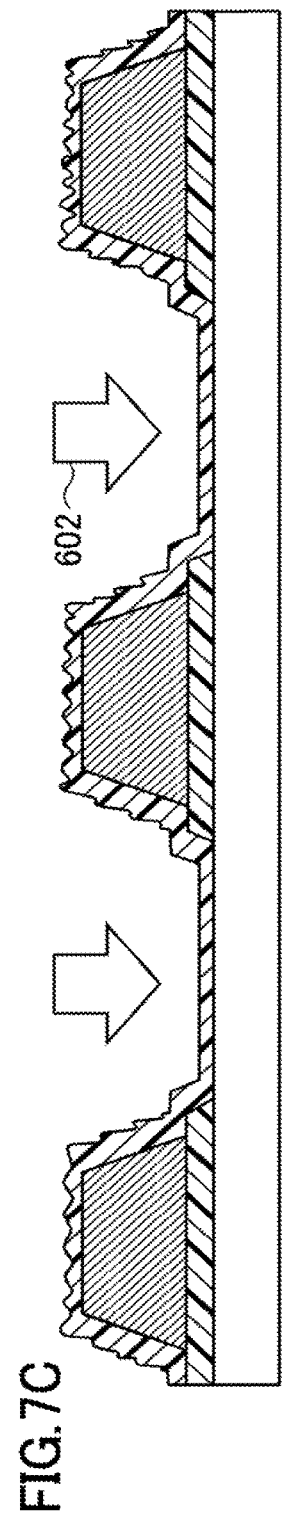

Next, as shown in FIG. 7C, the opening 200 corresponding to the pattern to be prepared by vapor deposition is formed in the second resin film 304. Specifically, for example, with a light shielding mask which transmits the laser beam 602 only in the area where the opening 200 is to be formed, the laser beam 602 is cast on the entire light shielding mask. Thus, the laser beam 602 is cast only on the area where the opening 200 is to be formed. Here, as the laser beam 602 used in the process of forming the opening in the second resin film 304, a laser beam 602 with higher energy than the laser beam 602 used for the surface roughening is used, as in the case of the laser beam 602 used in the process of eliminating the first resin film 300. The process of roughening the surface of the second resin film 304 and the process of forming the opening 200 in the second resin film 304 can be carried out in no particular order. Either one of the processes may be carried out first.

By the laser beam 602, the second resin film 304 formed in the area where the opening 200 is to be formed is eliminated, as shown in FIG. 8A. Finally, as the base 600 is eliminated, the mask foil 104 is completed, as shown in FIG. 8B.

As described above, by using the laser beam 602 in all of the process of eliminating the first resin film 300, the process of roughening the surface of the second resin film 304, and the process of forming the opening 200 in the second resin film 304, each of these processes can be carried out using a common emitting device for the laser beam 602. However, the method of roughening the surface of the second resin film is not limited to this. Specifically, for example, the surface of the second resin film 304 may be roughened by ashing, instead of casting the laser beam 602 on the second resin film 304.

Also, the process of roughening the surface of the second resin film 304 and the process of forming the opening in the second resin film 304 may be carried out in the same process. Specifically, for example, this process may be carried out using a light shielding mask which transmits the laser beam 602 in the area where the opening 200 is to be formed in the second resin film 304 and which half-transmits the laser beam 602 in the area where the surface of the second resin film 304 is to be roughened but does not transmit the laser beam 602 in the other areas. In the case where the laser beam 602 is cast on the mask foil 104 through the light shielding mask, the laser beam 602 with high energy which eliminates the second resin film 304 is cast in the area where the opening 200 is to be formed in the second resin film 304. Meanwhile, in the area where the surface of the second resin film 304 is to be roughened, the laser beam 602 with energy that is lower than the energy for eliminating the second resin film 304 but high enough to roughen the surface is cast. Moreover, since the laser beam 602 is not cast in the other areas, the process of roughening the surface of the second resin film 304 and the process of forming the opening in the second resin film 304 can be carried out in the same process.

Next, the method of manufacturing a display device using the shadow mask 100 manufactured by the above method will be described. This method of manufacturing a display device is a method of manufacturing a display device including a display panel and includes a process of obtaining the shadow mask 100 by the above method, and a process of forming a film of a pattern corresponding to the opening 200 formed in the mask foil 104 within the display panel, using the shadow mask 100.

Specifically, first, in a film deposition device such as a vapor deposition device, the shadow mask 100 is fixed in such a way that the surface provided with the first resin film 300 faces the display panel. Next, from a vapor deposition source arranged on the side where the second resin film 304 is provided, molecules of a film deposition material are discharged toward the display panel with the shadow mask 100 fixed thereto. The discharged molecules are deposited on the surface of the second resin film 304 of the mask foil 104 and on the surface of the display panel exposed through the opening 200 provided in the second resin film 304.

Then, as the fixed shadow mask 100 is eliminated from the display panel, a film of a pattern corresponding to the opening 200 formed in the mask foil 104 is formed on the display panel. The resulting film includes a light emitting element film made of a light emitting material, and an electrode for supplying a current to the light emitting film, corresponding to each subpixel in the display panel, for example, as shown in FIG. 2. Although the method of manufacturing the display device includes processes other than the process of forming the film of the pattern corresponding to the opening 200, those other processes will not be described here. The method of depositing molecules of the film deposition material is not limited to vapor deposition and may be other methods such as sputtering.

According to the manufacturing method, the film deposition material is deposited not only on the surface of the display panel but also on the surface of the second resin film 304 of the mask foil 104. However, according to the invention, since the surface of the second resin film 304 is roughened, the film deposition material deposited on the surface of the second resin film 304 will come off less easily than in the case where no surface roughening is carried out. Therefore, the risk of contamination of the vapor deposition source by the film deposition material that has come off, and the risk of entry of impurities into the display panel can be reduced.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A shadow mask comprising:
   a first resin film provided on a side facing a film deposition target;
   a metal part having a slit formed therein and provided on top of the first resin film; and
   a second resin film provided in such a way as to cover at least a part of a top of the metal part,
   wherein the second resin film is provided on a side exposed to a film deposition material, and a surface of the second resin film is roughened.
2. The shadow mask according to claim 1, wherein the second resin film has an opening corresponding to a pattern to be prepared, at a position overlapping with the slit, and is formed in such a way as to cover the first resin film and the metal part.
3. The shadow mask according to claim 1, wherein the first resin film has an opening corresponding to a pattern to be prepared, at a position overlapping with the slit, and
   the second resin is formed in such a way as to cover the metal part.
4. The shadow mask according to claim 1, wherein the surface of the second resin film is roughened by a laser beam.
5. The shadow mask according to claim 1, wherein the surface of the second resin film is roughened by ashing.
6. The shadow mask according to claim 1, wherein the second resin film is thinner than the first resin film.
7. A method of manufacturing a shadow mask, the method comprising steps of:
   forming a first resin film on a base;
   bonding a metal part having a slit provided therein onto the first resin film;
   eliminating the first resin film formed at a part of an area where the slit is provided;
   forming a second resin film in such a way as to cover the metal part, the first resin film, and the base;
   roughening a surface of the second resin film;
   forming an opening corresponding to a pattern to be prepared, in the second resin film; and
   eliminating the base.

8. A method of manufacturing a display device, the method comprising steps of:
- forming a first resin film on a base;
- bonding a metal part having a slit provided therein onto the first resin film;
- eliminating the first resin film formed at a part of an area where the slit is provided;
- forming a second resin film in such a way as to cover the metal part, the first resin film, and the base;
- roughening a surface of the second resin film;
- forming an opening corresponding to a pattern to be prepared, in the second resin film;
- eliminating the base and obtaining a shadow mask; and
- forming a film of the pattern in a display panel, using the shadow mask.

* * * * *